United States Patent
Ikeda et al.

(10) Patent No.: US 9,977,093 B2
(45) Date of Patent: May 22, 2018

(54) ELECTRONIC APPARATUS, SYSTEM FOR ESTIMATING DEGRADATION OF INTERNAL POWER SUPPLY, AND METHOD OF ESTIMATING DEGRADATION OF INTERNAL POWER SUPPLY

(71) Applicant: Konica Minolta, Inc., Chiyoda-ku, Tokyo (JP)

(72) Inventors: Yuki Ikeda, Hachioji (JP); Yoshihiko Eguchi, Tokorozawa (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 181 days.

(21) Appl. No.: 14/926,573

(22) Filed: Oct. 29, 2015

(65) Prior Publication Data

US 2016/0131721 A1    May 12, 2016

(30) Foreign Application Priority Data

Nov. 6, 2014  (JP) ................................ 2014-225890

(51) Int. Cl.
G01R 31/36    (2006.01)
(52) U.S. Cl.
CPC ................ G01R 31/3679 (2013.01)
(58) Field of Classification Search
None
See application file for complete search history.

(56) References Cited

U.S. PATENT DOCUMENTS

| 7,164,137 B2* | 1/2007 | Hayashida | ............ G01T 1/2018 |
| | | | 250/370.11 |
| 2012/0109443 A1* | 5/2012 | Takahashi | ............... B60L 1/003 |
| | | | 701/22 |

FOREIGN PATENT DOCUMENTS

JP        2000299137 A    10/2000

OTHER PUBLICATIONS

Masaki Murayama et al., "Study on Voltage Drop during Charge-discharge Test of Li Ion Secondary Battery"; 7 pages.

* cited by examiner

*Primary Examiner* — Paresh Patel
(74) *Attorney, Agent, or Firm* — Cantor Colburn LLP

(57) ABSTRACT

An electronic apparatus includes: an internal power supply to be charged; a charging circuit configured to supply electrical power from an external power supply to the internal power supply; a voltage measurement circuit configured to measure a voltage of the internal power supply; a temperature sensor configured to measure a temperature of the internal power supply; and an estimation circuit configured to estimate a degree of degradation of the internal power supply, wherein the estimation circuit determines whether it is possible to perform a degradation estimation process to estimate the degree of degradation of the internal power supply based on the voltage of the internal power supply and the temperature of the internal power supply, and performs the degradation estimation process on the internal power supply only when determining that it is possible to perform the degradation estimation process on the internal power supply.

13 Claims, 11 Drawing Sheets

ELECTRONIC APPARATUS, SYSTEM FOR ESTIMATING DEGRADATION OF INTERNAL POWER SUPPLY, AND METHOD OF ESTIMATING DEGRADATION OF INTERNAL POWER SUPPLY

CROSS REFERENCE TO RELATED APPLICATIONS

The present invention claims priority under 35 U.S.C. § 119 to Japanese Application No. 2014-225890 filed on Nov. 6, 2014, the entire content of which is incorporated herein by reference.

BACKGROUND OF THE INVENTION

Field of the Invention

The present invention relates to an electronic apparatus, a system for estimating degradation of an internal power supply, and a method of estimating degradation of an internal power supply. More particularly, the present invention relates to an electronic apparatus capable of estimating a degree of degradation of the electronic apparatus, a system for estimating degradation of an internal power supply, and a method of estimating degradation of an internal power supply.

Description of the Related Art

Many electronic apparatuses include an internal power supply formed with a capacitor, a battery, a secondary battery, an electricity storage device, or the like. When electrical power of a correct value is not output from such an internal power supply due to severe degradation of the internal power supply, the electronic apparatus functions in a wrong manner, or fails to function at all. Therefore, various techniques have been developed for determining degradation of an internal power supply.

There are various kinds of methods known as methods of determining degradation of an internal power supply. For example, degradation of an internal power supply can be determined from a phenomenon in which the voltage of the internal power supply (or the voltage between the positive terminal and the negative terminal of the internal power supply) drops due to the influence of the internal resistance or the like of the internal power supply when the supply of power to the internal power supply is stopped, as disclosed in JP 2000-299137 A and by Masaki MURAYAMA, et al. in "Study on Voltage Drop during Charge-discharge Test of Li Ion Secondary Battery", Mie Prefecture Industrial Research Institute Report No. 34 (2010), Mie Prefecture Industrial Research Institute (searched online, Nov. 5, 2014) (URL: http://www.mpstpc.pref.mie.lg.jp/KOU/kenhou/h21.htm).

As disclosed in JP 2000-299137 A and "Study on Voltage Drop during Charge-discharge Test of Li Ion Secondary Battery", and as schematically shown in FIG. 13, when the current supply to an internal power supply is stopped, the voltage V rapidly drops (see $\Delta V1$ in FIG. 13) immediately after the stop of the current supply, and after that, slowly drops with time (see $\Delta V2$ in FIG. 13, this component is also called the "relaxation" component in "Study on Voltage Drop during Charge-discharge Test of Li Ion Secondary Battery").

For example, JP 2000-299137 A discloses a secondary battery state determination method for determining the degree or the state of degradation of an internal power supply from the voltage drop $\Delta V1$, an internal resistance R1, and the like on the basis of the finding that, in a case where the internal power supply is degraded, the rapid voltage drop $\Delta V1$ immediately after the supply of power is stopped (or the internal resistance of the internal power supply calculated according to $R1=\Delta V1/I0$, which uses the current value I0 at the time when the supply of power is stopped) is larger than that in a case where the internal power supply is not degraded.

Meanwhile, "Study on Voltage Drop during Charge-discharge Test of Li Ion Secondary Battery" discloses that the internal resistance of an internal power supply calculated based on the above described rapid voltage drop $\Delta V1$ is higher in a case where the internal power supply is being used than that in a case where the internal power supply is in a brand-new state, and, after degradation of the internal power supply, the internal resistance is lower than that in the case where the internal power supply is being used. As for the "relaxation" resistance component calculated from the voltage drop $\Delta V2$ at the time when the voltage V slowly drops after the rapid drop, the "relaxation" resistance increases monotonically as the internal power supply is degraded from a brand-new state to a used state to a degraded state, as disclosed in "Study on Voltage Drop during Charge-discharge Test of Li Ion Secondary Battery".

In view of this, the inventors made a study on a method of determining a degree of degradation of an internal power supply based on the above mentioned "relaxation" component or the voltage drop $\Delta V2$ in a state where the voltage V of the internal power supply slowly drops with time (this state will be hereinafter referred to as a relaxed state as in "Study on Voltage Drop during Charge-discharge Test of Li Ion Secondary Battery") after the rapid drop of the voltage V immediately after the supply of power to the internal power supply is stopped.

As a result, the inventors have obtained the finding that a degree of degradation of an internal power supply can be appropriately estimated in some cases, but cannot be appropriately estimated in other cases. Based on this finding, a degree of degradation of an internal power supply is estimated in a situation where a degree of degradation of an internal power supply can be appropriately estimated. In this manner, the degree of degradation of an internal power supply is accurately estimated, and a severely-degraded internal power supply is replaced with a new one. Accordingly, an internal power supply can be prevented from failing to output electrical power of a correct value. Thus, an electronic apparatus can be appropriately prevented from functioning in a wrong manner or failing to function.

SUMMARY OF THE INVENTION

The present invention has been made in view of the above circumstances, and an object thereof is to provide an electronic apparatus capable of accurately estimating a degree of degradation of an internal power supply of the electronic apparatus, a system for estimating degradation of an internal power supply, and a method of estimating degradation of an internal power supply.

To achieve the abovementioned object, according to an aspect, an electronic apparatus reflecting one aspect of the present invention comprises: an internal power supply that can be charged; a charging circuit that supplies electrical power from an external power supply to the internal power supply; a voltage measurement circuit that measures the voltage of the internal power supply; a temperature sensor that measures the temperature of the internal power supply; and an estimation circuit that estimates a degree of degradation of the internal power supply, wherein the estimation circuit determines whether it is possible to perform a degradation estimation process to estimate the degree of degradation of the internal power supply based on the voltage of the internal power supply measured by the voltage measurement circuit and the temperature of the internal power supply measured by the temperature sensor, and performs the degradation estimation process on the internal power supply only when determining that it is possible to perform the degradation estimation process on the internal power supply.

To achieve the abovementioned object, according to an aspect, an internal power supply degradation estimating system reflecting one aspect of the present invention comprises: an electronic apparatus including: an internal power supply that can be charged; a charging circuit that supplies electrical power from an external power supply to the internal power supply; and a voltage measurement circuit that measures the voltage of the internal power supply; an estimation device that estimates a degree of degradation of the internal power supply of the electronic apparatus; and a temperature sensor that measures the temperature of the internal power supply, wherein the estimation device determines whether it is possible to perform a degradation estimation process to estimate the degree of degradation of the internal power supply based on the voltage of the internal power supply measured by the voltage measurement circuit and the temperature of the internal power supply measured by the temperature sensor, and performs the degradation estimation process on the internal power supply only when determining that it is possible to perform the degradation estimation process on the internal power supply.

To achieve the abovementioned object, according to an aspect, an internal power supply degradation estimating method of estimating a degree of degradation of an internal power supply of an electronic apparatus including: an internal power supply that can be charged; a charging circuit that supplies electrical power from an external power supply to the internal power supply; a voltage measurement circuit that measures the voltage of the internal power supply; and a temperature sensor that measures the temperature of the internal power supply, the method reflecting one aspect of the present invention comprises: a determination step of determining whether it is possible to perform a degradation estimation process to estimate the degree of degradation of the internal power supply based on the voltage of the internal power supply measured by the voltage measurement circuit and the temperature of the internal power supply measured by the temperature sensor, and a degradation estimation step of performing the degradation estimation process on the internal power supply only when the degradation estimation process on the internal power supply is determined to be possible in the determination step.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Hereinafter, an embodiment of an electronic apparatus, a system for estimating degradation of an internal power supply, and a method of estimating degradation of an internal power supply according to the present invention will be described with reference to the drawings. However, the scope of the invention is not limited to the illustrated examples.

In the description below, the electronic apparatus is a radiological imaging apparatus (a flat panel detector: FPD). However, the present invention is not limited to this embodiment.

[Example Structure of a Radiological Imaging Apparatus as an Example of an Electronic Apparatus]

Figure 1:
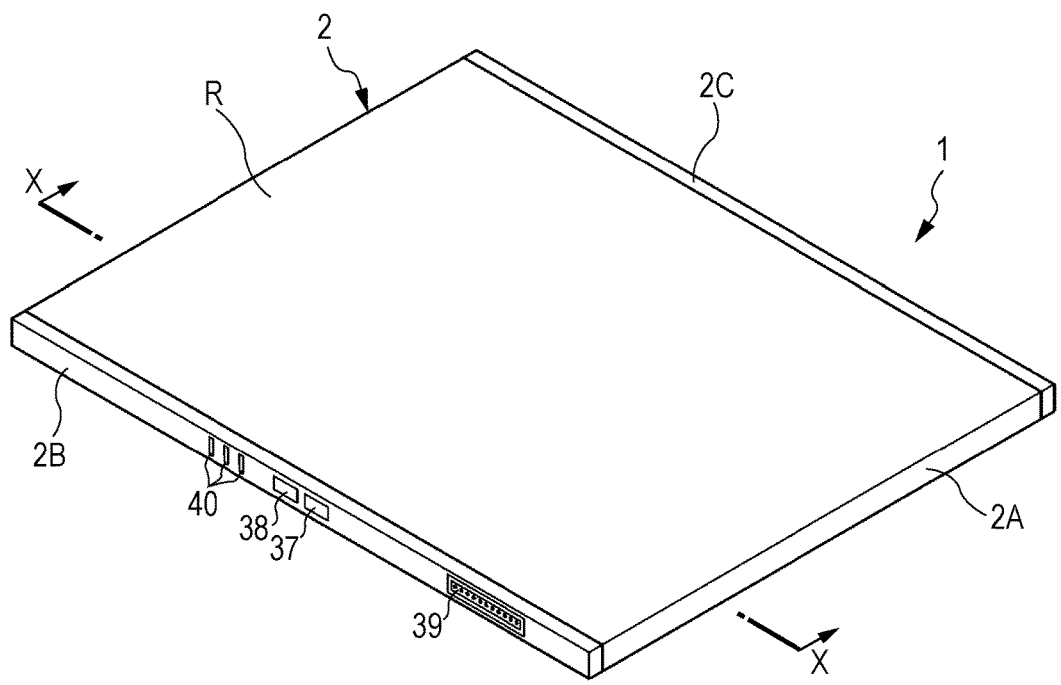
FIG. 1 is a perspective view of the exterior of a radiological imaging apparatus as an example of an electronic apparatus.
Figure 2:
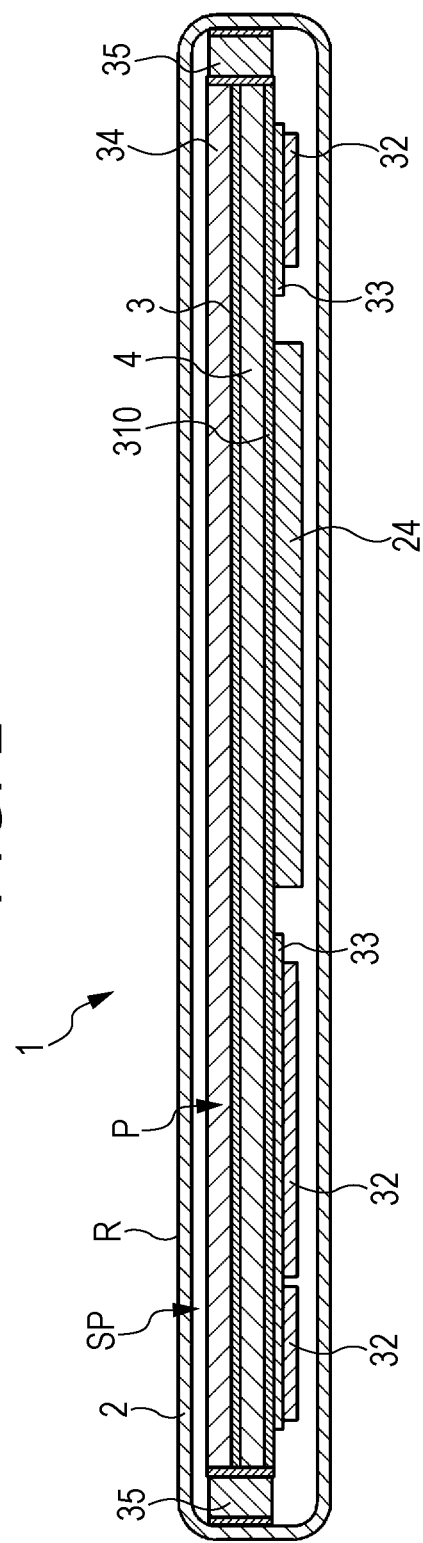
FIG. 2 is a cross-sectional view of the radiological imaging apparatus, taken along the X-X line defined in FIG. 1.

As an example of an electronic apparatus according to this embodiment, an example structure of a radiological imaging apparatus 1 is briefly described below. FIG. 1 is a perspective view of the exterior of the radiological imaging apparatus 1. FIG. 2 is a cross-sectional view of the radiological imaging apparatus 1, taken along the X-X line defined in FIG. 1.

As shown in FIGS. 1 and 2, the radiological imaging apparatus 1 is formed by placing a sensor panel SP formed with a scintillator 3, a substrate 4, and the like in a box-like housing 2. In this embodiment, the housing 2 is formed, as the openings at both sides of the housing main frame 2A that is a hollow rectangular cylinder having a radiation incidence surface R is closed with lid members 2B and 2C.

As shown in FIG. 1, a power switch 37, a selector switch 38, a connector 39, an indicator 40, and the like are formed in the lid member 2B at one side of the housing 2. The indicator 40 is formed with an LED or the like, and indicates the state of an internal power supply 24 (see FIG. 2 and FIG. 3, which will be described later), the operating state of the radiological imaging apparatus 1, and the like.

As will be described later, in this embodiment, the radiological imaging apparatus 1 as the electronic apparatus is inserted into and connected to a charger such as a cradle (see FIG. 4, which will be described later), or a cable is connected to the connector 39 (see FIG. 5, which will be described later), so that electrical power can be supplied from an external power supply (not shown), and the internal power supply 24 can be charged. As long as electrical power can be supplied to the internal power supply 24, the present invention is not limited to cases where the radiological imaging apparatus 1 is inserted into a charger, or where a cable is connected to the connector 39.

Although not shown in the drawings, in this embodiment, an antenna device (not shown) for conducting wireless transmission and reception of signals and the like between the radiological imaging apparatus 1 and an external device is provided in the lid member 2C on the other side of the housing 2 in such a manner that the antenna device is buried in the lid member 2C, for example.

As shown in FIG. 2, in the housing 2, abase 310 is placed below the substrate 4 via a thin lead plate or the like (not shown), and PCB substrates 33 having electronic components 32 and the like mounted therein, the internal power supply 24, and the like are attached to the base 310. A glass substrate 34 for protecting the substrate 4 and the radiation incidence surface R of the scintillator 3 is provided for the substrate 4 and the radiation incidence surface R of the scintillator 3, and buffers 35 are provided between the sensor panel SP and the side surfaces of the housing 2.

Although not shown in the drawings, radiation detection elements 7 formed with photodiodes or the like are arranged in a two-dimensional fashion (matrix fashion) on the detecting unit P of the substrate 4, and thin film transistors (hereinafter referred to as TFTs) 8 as switching units, scanning lines 5, signal lines 6, bias lines 9, and the like are connected to the respective radiation detecting elements 7. The scintillator 3 is provided so as to face the detecting unit P of the substrate 4.

Figure 3:
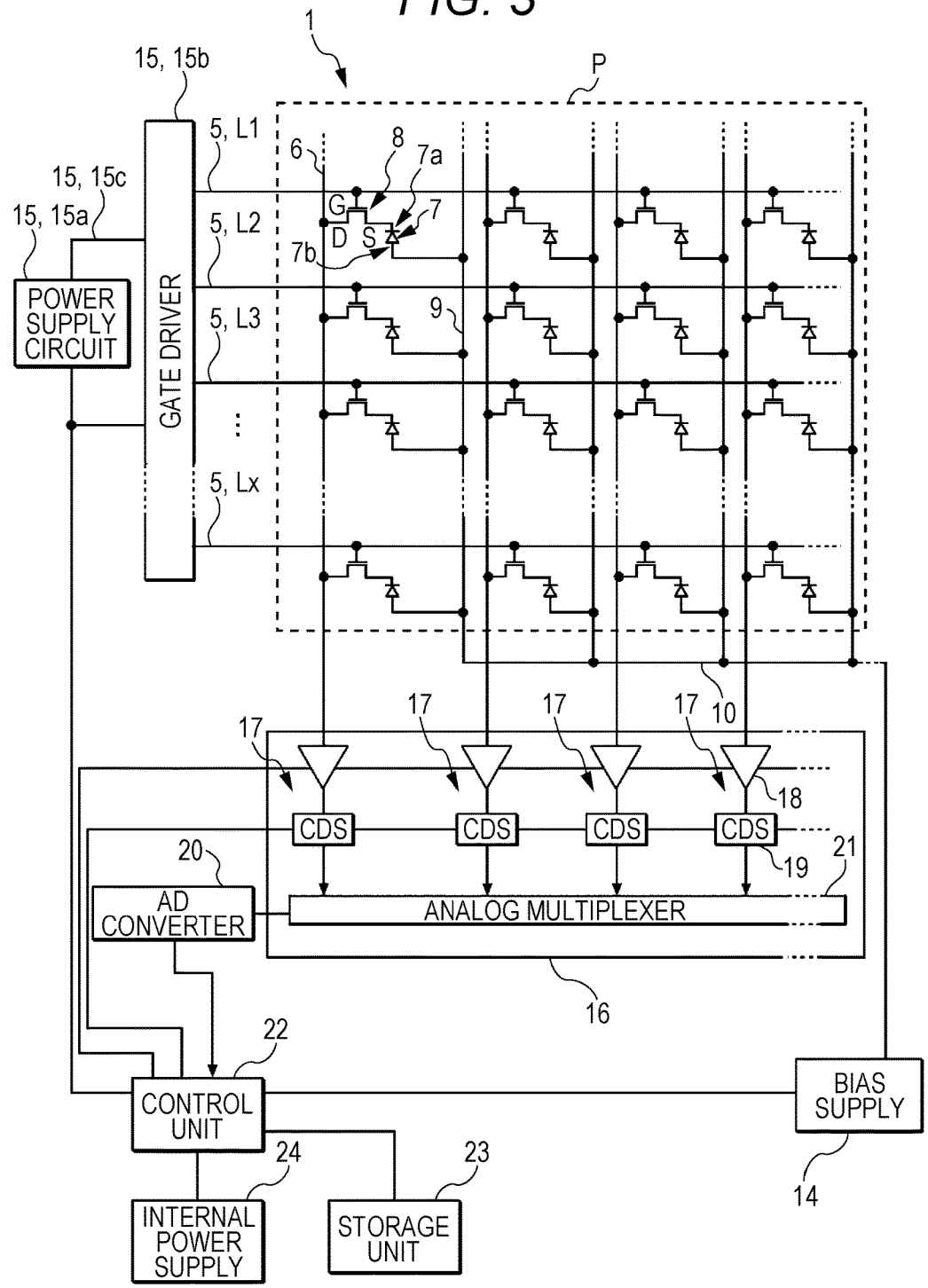
FIG. 3 is a block diagram showing the circuit configuration of the radiological imaging apparatus shown in FIG. 1.

Referring now to the block diagram shown in FIG. 3, the circuit configuration of the radiological imaging apparatus 1 is described. In this embodiment, the radiation detecting elements 7 are two-dimensionally arranged on the substrate 4, to form the detecting unit P. A bias line 9 is connected to a second electrode 7b of each of the radiation detecting elements 7, and each bias line 9 is connected to a connecting wire 10 and accordingly, is connected to a bias supply 14. A reverse bias voltage is applied from the bias supply 14 to the second electrode 7b of each of the radiation detecting elements 7 via the connecting wire 10 and the respective bias lines 9.

In a scanning drive unit 15, an on-state voltage and an off-state voltage are supplied from a power supply circuit 15a to a gate driver 15b via a wire 15c, and the voltage to be applied to respective lines L1 to Lx of the scanning lines 5 is switched between the on-state voltage and the off-state voltage by the gate driver 15b. As each TFT 8 is switched between an on-state and an off-state, a process of reading image data from each of the radiation detecting elements 7 is performed, for example.

The respective signal lines 6 are connected to respective readout circuits 17 formed in a readout IC 16, and each of the readout circuits 17 is formed with an amplifier circuit 18, a correlation double sampling circuit 19 (written as CDS in FIG. 3), and the like. An analog multiplexer 21 and an AD converter 20 are further provided in the readout IC 16.

During a process of reading image data from the respective radiation detecting elements 7, for example, the TFTs 8 connected to the scanning line 5 to which an on-state voltage is applied from the gate driver 15b are put into an on-state, charges are released to the signal lines 6 from the radiation detecting elements 7 connected to the TFTs 8 put into an on-state, and the released charges are subjected to charge/voltage conversion at the amplifier circuits 18 of the readout circuits 17.

The correlation double sampling circuits 19 provided on the output side of the amplifier circuits 18 calculate differences in value output from the amplifier circuits 18 between before and after the charges are released from the radiation detecting elements 7, and output the calculated differences as analog image data. The respective pieces of the output analog image data are sequentially transmitted to the AD converter 20 via the analog multiplexer 21, are sequentially converted into digital image data by the AD converter 20, and are sequentially output and stored into a storage unit 23. In this manner, the process of reading image data from the respective radiation detecting elements 7 is sequentially performed.

A control unit 22 is formed with a microcomputer in which a CPU (Central Processing Unit), a ROM (Read Only Memory), a RAM (Random Access Memory), an input/output interface, and the like are connected by a bus, an FPGA (Field Programmable Gate Array), or the like (not shown). The control unit 22 controls operations of the respective functional units, such as the scanning drive unit 15, the readout circuits 17, and the bias supply 14 of the radiological imaging apparatus 1.

The storage unit 23 formed with an SRAM (Static RAM), an SDRAM (Synchronous DRAM), or the like is connected to the control unit 22. Although not shown in FIG. 3, in this embodiment, the power switch 37, the selector switch 38, the connector 39, and the indicator 40 (see FIG. 1), which have been described above, and an antenna device and the like are also connected to the control unit 22.

The internal power supply 24 for supplying electrical power to the respective functional units such as the control unit 22, the scanning drive unit 15, the readout circuits 17, and the bias supply 14 is also connected to the control unit 22. In this embodiment, a lithium-ion capacitor (LiC) is used as the internal power supply 24. However, the present invention is not limited to this, and it is possible to use any internal power supply that can perform charging. For example, it is possible to use an electricity storage device such as an electrical double layer capacitor, a battery such as a lithium-ion battery, or a secondary battery.

[Connection of the Electronic Apparatus to a Charger or a Cable]

Figure 4:
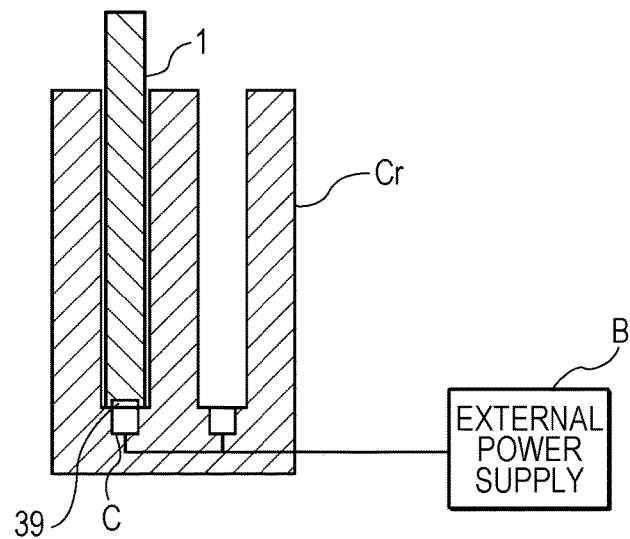
FIG. 4 is a cross-sectional diagram showing a situation where the radiological imaging apparatus is inserted into a cradle, and the connectors are connected to each other.

In a case where the radiological imaging apparatus 1 as the electronic apparatus is charged when being inserted into and connected to a charger such as a cradle, the connector 39 of the radiological imaging apparatus 1 and a connector C of a charger Cr can be automatically connected at the time when the radiological imaging apparatus 1 is inserted into the charger Cr, as shown in FIG. 4, for example.

Figure 5:
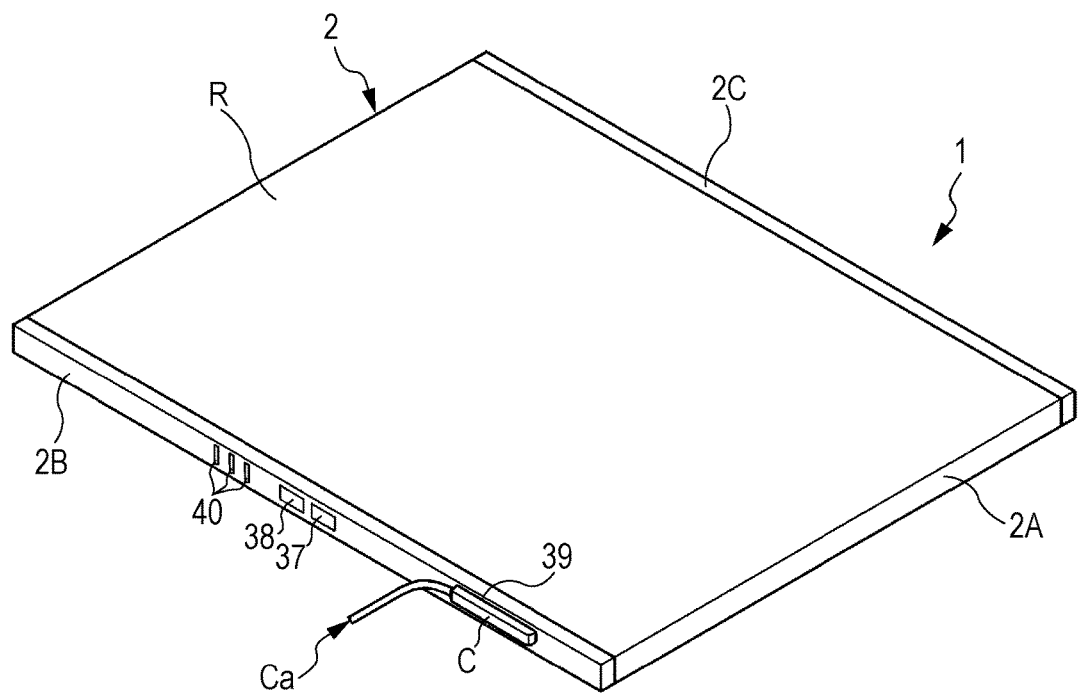
FIG. 5 is a perspective view of the radiological imaging apparatus having a cable connected thereto.

Alternatively, the connector C of a cable Ca can be connected to the connector 39 of the radiological imaging apparatus 1, as shown in FIG. 5, for example. In a situation where the connector C of the charger Cr or the cable Ca is connected to the connector 39 of the radiological imaging apparatus 1, electrical power can be supplied from an external power supply B (not shown in FIG. 5) to the radiological imaging apparatus 1.

[Structure and the Like Related to Charging of the Internal Power Supply in the Electronic Apparatus]

Prior to a description of a process of estimating degradation of the internal power supply 24 in the estimation circuit of the electronic apparatus (radiological imaging apparatus 1) according to this embodiment, the structure and the like related to charging of the internal power supply 24 of an electronic apparatus such as the above described radiological imaging apparatus 1 are described. The structure and the like related to charging of the internal power supply 24 are to be used in the process of estimating degradation of the internal power supply 24. In the description below, an electronic device such as the radiological imaging apparatus 1 will be described as the electronic apparatus 1 in a general form.

Figure 6:
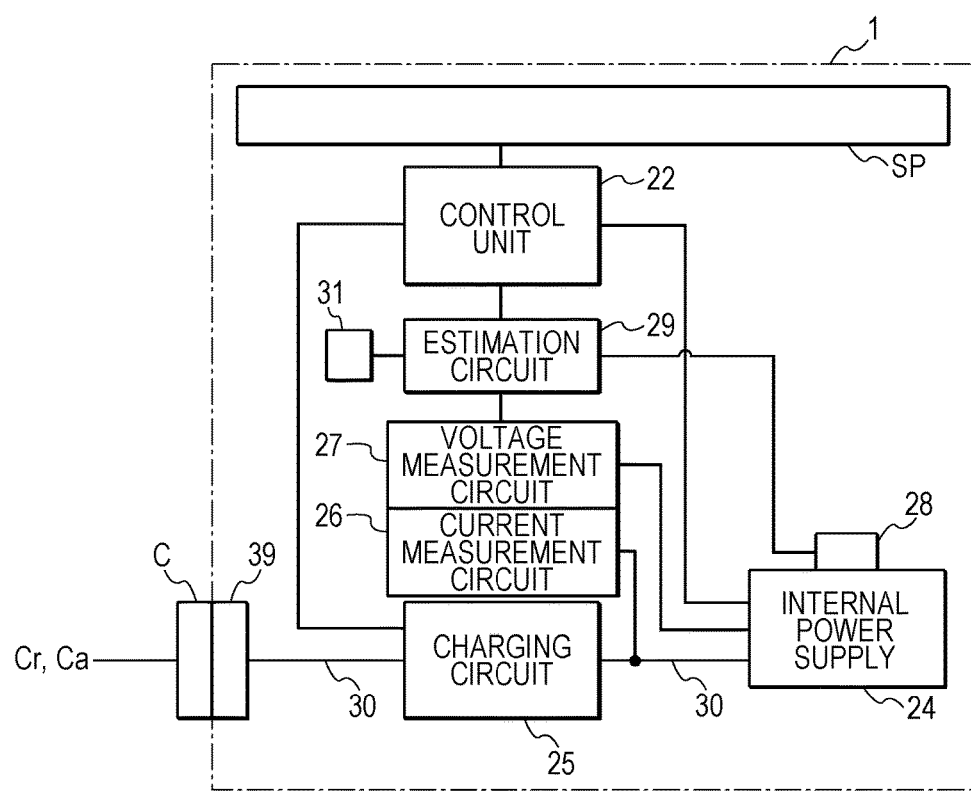
FIG. 6 is a block diagram for explaining the structure and the like related to charging of the internal power supply of the electronic apparatus.

FIG. 6 is a block diagram for explaining the structure and the like related to charging of the internal power supply 24 of the electronic apparatus 1. In FIG. 6, the charger Cr such as a cradle or the cable Ca is connected to the connector 39 of the electronic apparatus 1 via the connector C, and electrical power is supplied from an external power supply (not shown in FIG. 6) via the charger Cr or the cable Ca, as shown in FIG. 4 or 5. However, there are cases where the electronic apparatus 1 is designed so that only the charger Cr or only the cable Ca can be connected to the connector 39 of the electronic apparatus 1.

As described above, in the electronic apparatus 1, the internal power supply 24 is electrically connected to the respective functional units such as the control unit 22. In FIG. 6, the respective functional units such as the scanning drive unit 15, the readout circuit 17, and the bias supply 14 (see FIG. 3), except for the control unit 22, are collectively shown as the sensor panel SP.

A charging circuit 25 for charging the internal power supply 24 is provided on a charging power supply line 30 extending from the connector 39 to the internal power supply 24. Although not shown in the drawing, a reverse-flow prevention circuit or the like for preventing current from flowing in the reverse direction from the charging circuit 25 to the connector 39, for example, may also be provided between the charging circuit 25 and the connector 39.

The charging circuit 25 supplies electrical power supplied from the external power supply B (which is shown in FIG. 4, and also exists in a case where the cable Ca (see FIG. 5) is connected thereto) to the internal power supply 24. For example, when charging the internal power supply 24, the charging circuit 25 performs constant-current charging by supplying a constant current of a predetermined current value to the internal power supply 24 until the voltage of the internal power supply 24 reaches a predetermined voltage value. After the voltage of the internal power supply 24 reaches the predetermined voltage value, the charging circuit 25 performs constant-voltage charging by supplying a constant voltage to the internal power supply 24. In this manner, the charging circuit 25 can charge the internal power supply 24.

In this embodiment, the electronic apparatus 1 further includes a current measurement circuit 26, a voltage measurement circuit 27, a temperature sensor 28, and an estimation circuit 29, for example. In FIG. 6, the current measurement circuit 26, the voltage measurement circuit 27, and the estimation circuit 29 are shown separately from the control unit 22 of the electronic apparatus 1. However, one of or all of the current measurement circuit 26, the voltage measurement circuit 27, and the estimation circuit 29 may be formed in the control unit 22. That is, the control unit 22 of the electronic apparatus 1 may be designed to function as the current measurement circuit 26, the voltage measurement circuit 27, and the estimation circuit 29, for example.

The current measurement circuit 26 measures the value I of the current being supplied from the charging circuit 25 to the internal power supply 24, and transmits the measured current value I to the estimation circuit 29. In a case where the value I of the current to be supplied from the charging circuit 25 to the internal power supply 24 at the time of charging of the electronic apparatus 1 is fixed at a constant value, for example, the value I of the current to be supplied from the charging circuit 25 to the internal power supply 24 is known in advance, and therefore, there is no need to prepare the current measurement circuit 26.

The voltage measurement circuit 27 measures the voltage V of the internal power supply 24, and transmits the measured voltage V to the estimation circuit 29. In a case where a circuit that measures the voltage V of the internal power supply 24 is formed in the above described charging circuit 25, the circuit may be regarded as the voltage measurement circuit 27, and the voltage V of the internal power supply 24 measured by the circuit may be transmitted to the estimation circuit 29.

In this embodiment, the temperature sensor 28 that measures the temperature T of the internal power supply 24 is provided in the vicinity of the internal power supply 24 or in contact with the internal power supply 24. The temperature sensor 28 is not limited to a particular type of sensor, as long as it can accurately measure the temperature T of the internal power supply 24 and transmit the measured temperature T of the internal power supply 24 to the estimation circuit 29.

The estimation circuit 29 estimates the degree of degradation of the internal power supply 24 based on the current value I, and the voltage V and the temperature T of the internal power supply 24, which have been transmitted from the current measurement circuit 26, the voltage measurement circuit 27, and the temperature sensor 28 (or the voltage V and the temperature T of the internal power supply 24 transmitted from the voltage measurement circuit 27 and the temperature sensor 28 in a case where the current measurement circuit 26 is not provided as described above).

[Process of Estimating Degradation of the Internal Power Supply in the Estimation Circuit of the Electronic Apparatus]

Next, a process of estimating degradation of the internal power supply 24 in the estimation circuit 29 of the electronic apparatus 1 is described. The actions of the electronic apparatus 1 according to this embodiment are also described below. The description below is also a description of a process of estimating degradation of an internal power supply according to this embodiment of the present invention.

Figure 13:
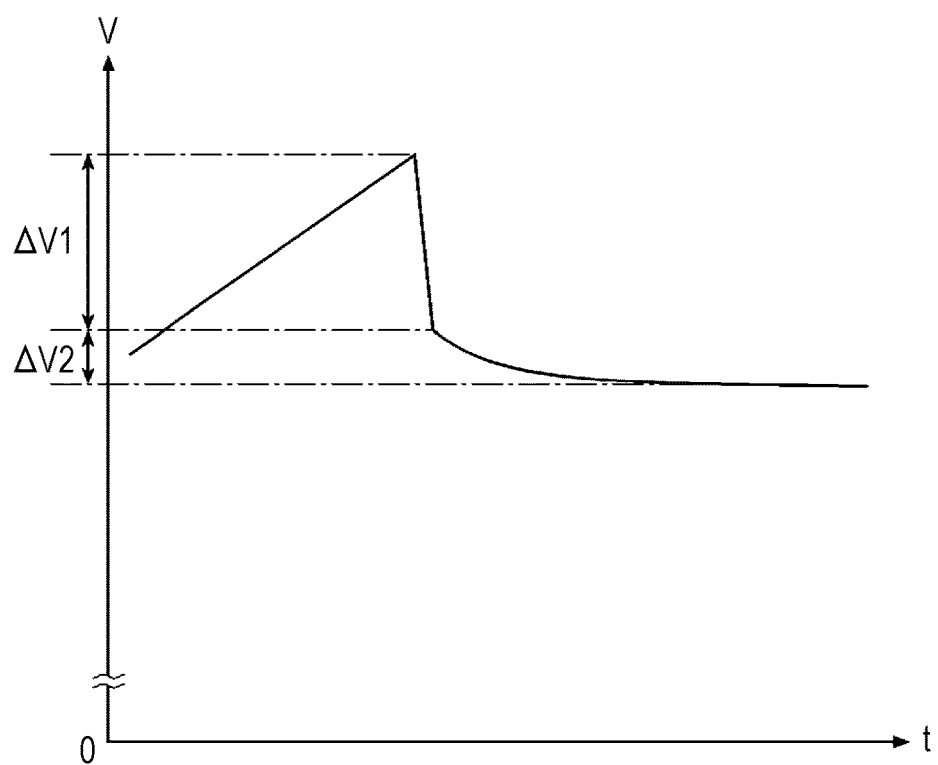
FIG. 13 is a graph for explaining that a rapid voltage drop appears immediately after the supply of power to an internal power supply is stopped, and the voltage drop becomes slower with time.

In this embodiment, charging is performed as a current having the current value I is supplied from the charging circuit 25 to the internal power supply 24, as described above. A process of estimating degradation of the internal power supply 24 is performed based on a change $\Delta V$ in the voltage V of the internal power supply 24 measured by the voltage measurement circuit 27 after the current supply is suspended (see FIG. 13).

Figure 7:
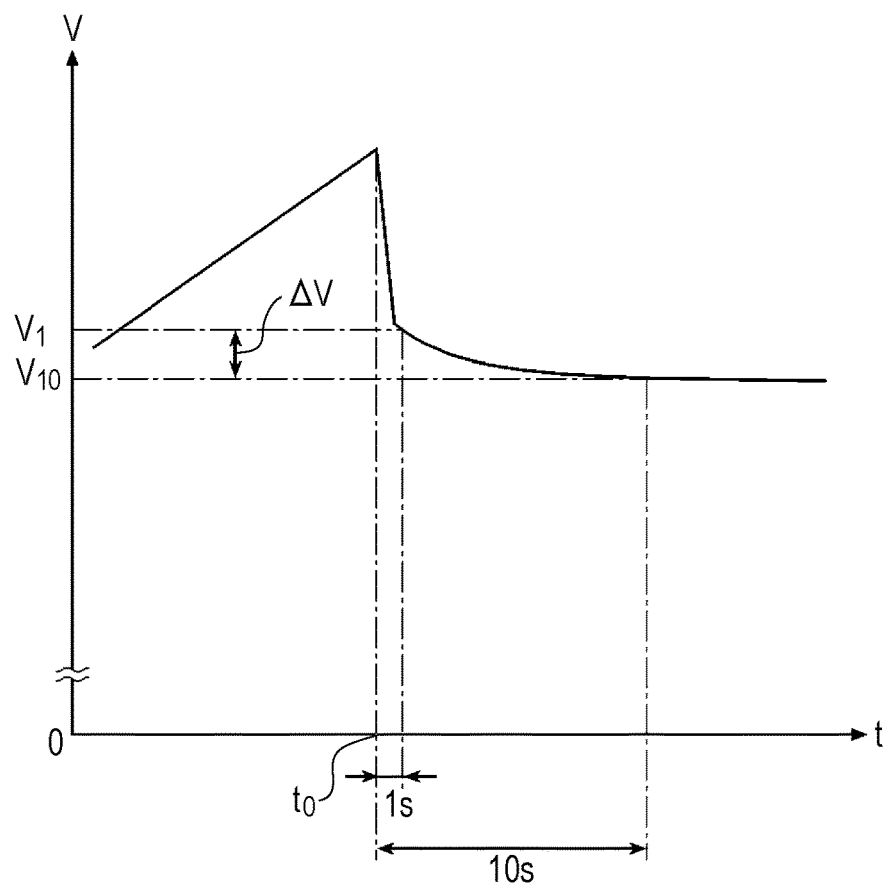
FIG. 7 is a graph for explaining the temporal change in the voltage of the internal power supply after current supply is stopped, and the change or the like in the voltage in a relaxed state.

Specifically, in this embodiment, the voltage V of the internal power supply 24 is increased by a predetermined amount (100 mV or 200 mV, for example) through a supply of a current having the current value I from the charging circuit 25 to the internal power supply 24. After the current supply is stopped, the estimation circuit 29 measures the voltage V of the internal power supply 24 through the voltage measurement circuit 27. As shown in FIG. 7, the measured voltage V rapidly drops in a discharge state after the charging. At the time when the voltage V switches to a slowly decreasing state (the above described relaxed state), the change ΔV in the voltage V is measured.

At this point, as shown in the equation (1) shown below, for example, the change ΔV in the voltage V of the internal power supply 24 can be calculated as the difference between the voltage $V_1$ of the internal power supply 24 measured by the voltage measurement circuit 27 one second after time $t_0$ when the current supply from the charging circuit 25 to the internal power supply 24 is stopped and the voltage $V_{10}$ of the internal power supply 24 measured by the voltage measurement circuit 27 ten seconds after the time $t_0$ of the stop of the current supply (see FIG. 7).

$$\Delta V = V_1 - V_{10} \qquad (1)$$

As disclosed in "Study on Voltage Drop during Charge-discharge Test of Li Ion Secondary Battery" or the like, there are cases where the voltage V of the internal power supply 24 being measured by the voltage measurement circuit 27 further drops in a relaxed state even after ten seconds have passed since the time $t_0$ when the current supply from the charging circuit 25 to the internal power supply 24 was stopped. However, the study made by the inventors has made it clear that, where the change ΔV in the voltage V of the internal power supply 24 is defined as described above, the degree of degradation of the internal power supply 24 can be appropriately estimated in the manner described below.

Meanwhile, in this embodiment, the estimation circuit 29 estimates the degree of degradation of the internal power supply 24 by calculating the capacity C of the internal power supply 24 based on the change ΔV in the voltage V of the internal power supply 24 in a relaxed state calculated in the above described manner. As the internal power supply 24 is degraded further, the capacity C of the internal power supply 24 becomes smaller. Therefore, the capacity C of the internal power supply 24 is calculated as described above, and the calculated capacity C is compared with the initial capacity $C_0$ of the internal power supply 24 measured in the brand-new state, so that the degree of degradation of the internal power supply 24 can be estimated.

In this case, as disclosed in "Study on Voltage Drop during Charge-discharge Test of Li Ion Secondary Battery" or the like, it is possible to estimate the degree of degradation of the internal power supply 24 by estimating the internal resistance or the like of the internal power supply 24. In a case where the degree of degradation of the internal power supply 24 or the capacity C of the internal power supply 24 is estimated based on the change ΔV in the voltage V of the internal power supply 24 in a relaxed state as described above, the capacity C of the internal power supply 24 can be calculated based on the change ΔV in the voltage V of the internal power supply 24 with the use of constants a and d, as shown in the equation (2) below, for example.

$$C = a \times \Delta V + d \qquad (2)$$

In a case where the temperature T of the internal power supply 24 is fixed, the larger the change ΔV in the voltage V of the internal power supply 24 calculated as above, the severer the degradation of the internal power supply 24 (or the smaller the capacity C of the internal power supply 24). However, the study made by the inventors has also made it clear that, in a case where the temperature T of the internal power supply 24 is low, the change ΔV in the voltage V of the internal power supply 24 might also be large.

That is, a large change ΔV in the voltage V of the internal power supply 24 does not necessarily mean severe degradation of the internal power supply 24, and there is a possibility that the temperature T of the internal power supply 24 becomes lower due to a low external temperature or a low temperature inside the electronic apparatus 1 (radiological imaging apparatus 1), and therefore, the change ΔV in the voltage V of the internal power supply 24 becomes larger.

As described above, the change ΔV in the voltage V of the internal power supply 24 might vary depending on the temperature T of the internal power supply 24. According to the study made by the inventors, the degree of degradation of the internal power supply 24 (the capacity C of the internal power supply 24 in this embodiment) can be estimated by taking into account the temperature T of the internal power supply 24, instead of taking into account only the change ΔV in the voltage V of the internal power supply 24 in a relaxed state calculated in the above described manner.

In view of the above, the degree of degradation of the internal power supply 24, or the capacity C of the internal power supply 24, can be calculated based on the change ΔV in the voltage V of the internal power supply 24 and the temperature T of the internal power supply 24 with the use of constants a, b, and d, as shown in the equation (3) below.

$$C = a \times \Delta V + b \times T + d \qquad (3)$$

Alternatively, the capacity C of the internal power supply 24 can be expressed as a product of the change ΔV and the temperature T of the internal power supply 24 with the use of constants e and f, as shown in the equation (3*) below.

$$C = e \times \Delta V \times T + f \qquad (3^*)$$

Further, according to the study made by the inventors, the change ΔV in the voltage V of the internal power supply 24 also varies with the value I of the current that is supplied from the charging circuit 25 to the internal power supply 24 so as to increase the voltage V of the internal power supply 24 by a predetermined amount. That is, the change ΔV in the voltage V of the internal power supply 24 becomes larger as the current value I becomes larger, and the change ΔV in the voltage V of the internal power supply 24 becomes smaller as the current value I becomes smaller. Even if the change ΔV in the voltage V of the internal power supply 24 calculated as above is large, the degradation of the internal power supply 24 is not necessarily severe, and the change ΔV might have been increased simply because the value I of the current supplied from the charging circuit 25 to the internal power supply 24 was large.

As described above, the change ΔV in the voltage V of the internal power supply 24 might also vary depending on the value I of the current being supplied from the charging circuit 25 to the internal power supply 24. In view of this, the electronic apparatus 1 (radiological imaging apparatus 1) can be inserted into and connected to the charger Cr such as a cradle (see FIG. 4), or the cable Ca can be connected to the connector 39 (see FIG. 5), as in this embodiment. Furthermore, in a case where there is a difference in the value I of the current that is supplied from the charging circuit 25 to the internal power supply 24 so as to increase the voltage V of the internal power supply 24 by a predetermined amount between a case where the electronic apparatus 1 is connected to the charger Cr and a case where the cable Ca is connected to the electronic apparatus 1, the capacity C (or the degree of degradation) of the internal power supply 24 can be calculated according to the equation (4) or (4*) shown below. The equations (4) and (4*) are formed by adding the term of the value I of the current to the above equations (3) and (3*), respectively.

$$C = a \times \Delta V + b \times T + c \times I + d \qquad (4),\ \text{or}$$

$$C = e \times \Delta V \times T \times I + f \qquad (4^*)$$

In the description below, the capacity C (or the degree of degradation) of the internal power supply 24 is calculated according to the above equation (4) taking into account the value I of the current to be supplied from the charging circuit 25 to the internal power supply 24 so as to increase the voltage V of the internal power supply 24 by a predetermined amount, or the value I of the current varies between a case where the charger Cr is connected to the electronic apparatus 1 and a case where the cable Ca is connected to the electronic apparatus 1. However, the present invention is not limited to that.

For example, in a case where the value I of the current to be supplied from the charging circuit 25 to the internal power supply 24 is fixed at a certain value as described above, the influence of the value I of the current is constant, and accordingly, the capacity C of the internal power supply 24 can be calculated according to the above equation (3) in which the influence of the current value I is represented by the constant term d. Alternatively, the capacity C of the internal power supply 24 can be calculated according to the above equation (3*) in which the influence of the current value I is represented by the coefficient e.

Further, in a case where the value I of the current to be supplied from the charging circuit 25 to the internal power supply 24 is fixed at a certain value, and the capacity C of the internal power supply 24 is hardly affected by the temperature T of the internal power supply 24, the capacity C of the internal power supply 24 can be calculated according to the above equation (2).

In the description below, an example case where the degree of degradation of the internal power supply 24 is estimated through calculation of the capacity C of the internal power supply 24 according to the above equation (4). However, the present invention is not limited to this example, and cases where the capacity C of the internal power supply 24 is calculated according to the above equation (2), (3), (3*), or (4*), or some other technique can be explained in the same manner as the example case described below.

In the case where the capacity C of the internal power supply 24 is calculated according to the above equation (4), the changes ΔV in the voltage V of the internal power supply 24 are measured beforehand while the temperature T of the internal power supply 24 and the value I of the current to be supplied from the charging circuit 25 to the internal power supply 24 so as to increase the voltage V of the internal power supply 24 by a predetermined amount are varied to several values. This measurement is carried out when the internal power supply 24 is in the brand-new state and when the internal power supply 24 is degraded to various degrees. In this manner, various sets of the temperature T of the internal power supply 24, the value I of the current, and the change ΔV in the voltage V of the internal power supply 24 are obtained.

At the same time, the actual capacity C of the internal power supply 24 in each case is calculated or measured by a known technique. In each case, the constants a, b, c, and d in the above equation (4) are determined beforehand so that the actual capacity C of the internal power supply 24 can be accurately reproduced with the temperature T of the internal power supply 24, the value I of the current, and the change ΔV in the voltage V of the internal power supply 24, which are measured in the case.

In this embodiment, the estimation circuit 29 stores the constants a, b, c, and d (or the above equation (4)) determined in the above manner in a memory 31 or a program. In this case, the memory 31 may be a memory exclusive for the estimation circuit 29, may be a shared storage unit provided in the control unit 22 or the like, or may be the above described storage unit 23 (see FIG. 3) formed with an SRAM or an SDRAM or the like in the electronic apparatus 1.

When performing a process of estimating degradation of the internal power supply 24, the estimation circuit 29 calculates the capacity C of the internal power supply 24 by assigning, into the above equation (4), the temperature T of the internal power supply 24 measured by the temperature sensor 28, the value I of the current measured by the current measurement circuit 26 when the current is supplied from the charging circuit 25 to the internal power supply 24 so as to increase the voltage V of the internal power supply 24 by a predetermined amount, and the change ΔV in the voltage V of the internal power supply 24 in the above described relaxed state. The estimation circuit 29 then compares the calculated capacity C of the internal power supply 24 with the initial capacity $C_0$ of the internal power supply 24 in the brand-new state written in the memory 31 or the program, for example. In this manner, the estimation circuit 29 estimates the degree of degradation of the internal power supply 24.

As long as the constants a, b, c, and d are accurately determined beforehand with the above described arrangement, even if a large value is obtained as the change ΔV in the voltage V of the internal power supply 24 when the internal power supply 24 is in the brand-new state and the capacity C thereof is the initial capacity $C_0$, for example, the large change ΔV is obtained simply because the temperature T of the internal power supply 24 is low, or the value I of the current is large. Therefore, those values are multiplied by the constants a, b, c, and d, and are then combined (see the above equation (4)), so that the capacity C of the internal power supply 24 can be calculated as the initial capacity $C_0$. Accordingly, it becomes possible to correctly determine that the internal power supply 24 has not been degraded yet.

When the internal power supply 24 is degraded, and the capacity C thereof drops from the initial capacity $C_0$, for example, a measured change ΔV in the voltage V of the internal power supply 24, a measured temperature T of the internal power supply 24, and a measured value I of the current are multiplied by the constants a, b, c, and d, and are then combined (see the above equation (4)), so that a smaller capacity C than the initial capacity $C_0$ can be accurately obtained as the capacity C of the internal power supply 24. Accordingly, it becomes possible to accurately determine that the internal power supply 24 has been degraded, and accurately recognize the degree of the degradation.

The degree of degradation of the internal power supply 24 can be calculated as the capacity C of the internal power supply 24 as described above, or can be calculated as a difference ($C_0-C$) from the initial capacity $C_0$, or can be calculated as a ratio $C/C_0$ with respect to the initial capacity $C_0$. Further, a minimum capacity Cmin corresponding to a degradation degree of 100% may be determined in advance, for example, and a difference (C−Cmin) from the minimum capacity Cmin or a ratio C/Cmin with respect to the minimum capacity Cmin may be calculated as the degree of degradation of the internal power supply 24. Alternatively, the difference and the ratio may be combined to obtain (C−Cmin)/($C_0$−Cmin), for example. In this manner, the degree of degradation of the internal power supply 24 is expressed in a various manner based on the capacity C of the internal power supply 24.

[Determination as to Whether an Internal Power Supply Degradation Estimation Process can be Performed]

The study made by the inventors has made it clear that there are cases that, when the constants a, b, c, and d are determined beforehand in the above described manner, the constants a, b, c, and d can be accurately determined, and the degree of degradation (the capacity C) of the internal power supply 24 can be appropriately estimated. However, the study made by the inventors has also made it clear that, in other cases, the constants a, b, c, and d cannot be accurately determined even though the constants a, b, c, and d are calculated in the above described manner, and the degree of degradation (the capacity C) of the internal power supply 24 cannot always be estimated appropriately.

The inventors made further study, and as a result, have found that there is a certain relation between the temperature T of the internal power supply 24 and the range of the voltage V of the internal power supply 24 that enables accurate determination of the above constants a, b, c, and d at the temperature T (or an accurate process of estimating degradation of the internal power supply 24). This aspect is described below in detail.

Figure 8:
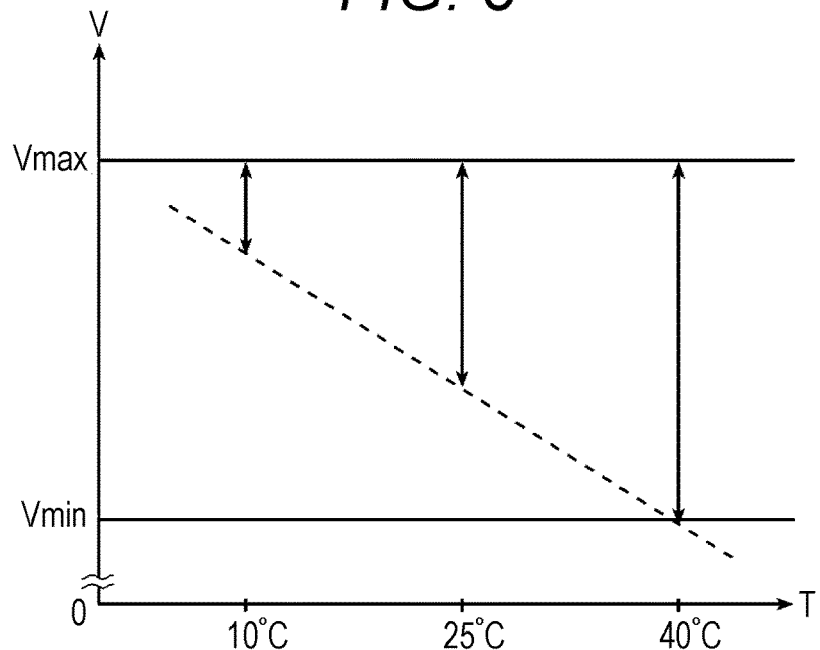
FIG. 8 is a graph schematically showing the relation between the temperature of the internal power supply and the range of the voltage of the internal power supply that enables an accurate process of estimating degradation of the internal power supply at the temperature.
Figure 9:
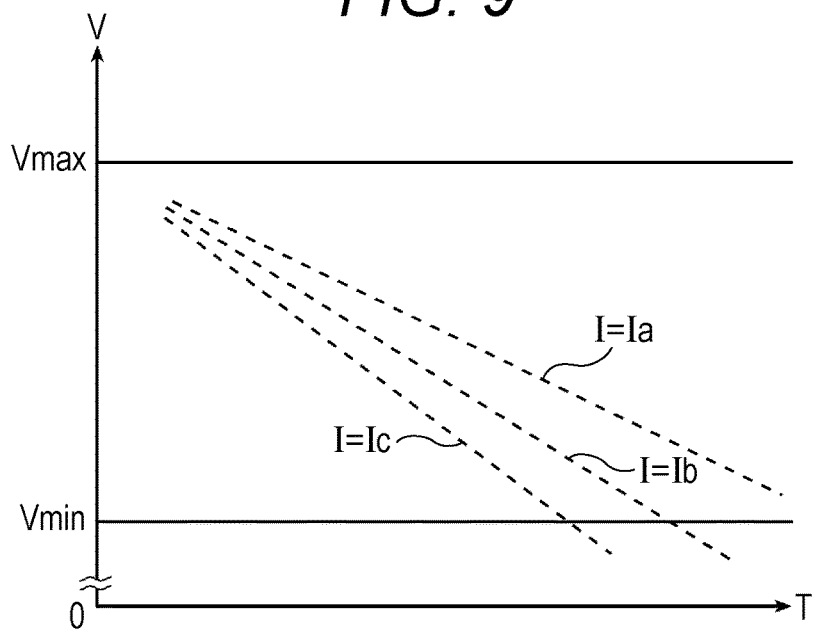
FIG. 9 is a graph for explaining that the lower limit of the range of the voltage V of the internal power supply that can enable an accurate process of estimating degradation of the internal power supply at each temperature of the internal power supply varies with the value of the current being supplied from the charging circuit to the internal power supply.

FIG. 8 is a graph schematically showing the relation between the temperature T of the internal power supply 24 and the range of the voltage V of the internal power supply 24 that enables an accurate process of estimating degradation of the internal power supply 24 at the temperature T. In FIG. 8 and FIG. 9, which will be described later, Vmax and Vmin represent the upper limit and the lower limit of voltages V that can be allowed as the voltage V of the internal power supply 24.

According to the study made by the inventors, the region above the dashed line (or the region between the dashed line and the upper limit Vmax of the voltage V of the internal power supply 24) in the graph shown in FIG. 8 represents the range in which the constants a, b, c, and d can be accurately determined in the above manner, and the degree of degradation (the capacity C) of the internal power supply 24 can be appropriately estimated. That is, in the region below the dashed line (or the region between the dashed line and the lower limit Vmin of the voltage V of the internal power supply 24) in the graph shown in FIG. 8, the constants a, b, c, and d cannot be accurately determined even though the constants a, b, c, and d are calculated in the above described manner, and it is difficult to accurately estimate the degree of degradation (the capacity C) of the internal power supply 24.

One of the possible causes of such a phenomenon is as follows. If the temperature T of the internal power supply 24 is fixed, and the value I of the current that is supplied from the charging circuit 25 to the internal power supply 24 so as to increase the voltage V of the internal power supply 24 by a predetermined amount is also fixed, the change ΔV in the voltage V of the internal power supply 24 in a relaxed state (see FIG. 7) should become larger as the internal power supply 24 is further degraded.

In the region below the dashed line in the graph shown in FIG. 8, however, when the change ΔV in the voltage V of the internal power supply 24 in a relaxed state is measured in the above manner at a fixed temperature T of the internal power supply 24 and with a fixed value I of the current, the change ΔV in the voltage V of the internal power supply 24 does not increase in accordance with degradation of the internal power supply 24 even if the degradation has become severe, and only a value similar to the change ΔV in the voltage V of the internal power supply 24 in the brand-new state is obtained, for some unknown reason. This is considered to be one of the possible causes of the above described phenomenon.

In such a situation, even if the above described results of the experiment in which the temperature T and the current value I are fixed and the change ΔV in the voltage V hardly varies are assigned into the equation (4) to determine such constants a, b, c, and d as to enable calculation of the actual capacity C of the internal power supply 24, the obtained values greatly differ from the constants a, b, c, and d determined from the experiment carried out in the region above the dashed line in the graph shown in FIG. 8.

Even if the constants a, b, c, and d determined from the experiment carried out in the region below the dashed line in the graph shown in FIG. 8 are assigned into the equation (4), and the change ΔV in the voltage V of the internal power supply 24 in a relaxed state obtained in the experiment carried out in the region above the dashed line in the graph shown in FIG. 8, and the corresponding temperature T of the internal power supply 24 and the corresponding value I of the current are assigned into the equation (4), for example, the actual capacity C of the internal power supply 24 cannot be accurately reproduced in most cases.

Therefore, in the electronic apparatus 1 (radiological imaging apparatus 1) according to this embodiment, before performing the above described degradation estimation process to estimate the degree of degradation of the internal power supply 24, the estimation circuit 29 (see FIG. 6) determines whether it is possible to perform the process of estimating degradation of the internal power supply 24 based on the voltage V of the internal power supply 24 measured by the voltage measurement circuit 27 and the temperature T of the internal power supply 24 measured by the temperature sensor 28. Only if it is possible to perform the process of estimating degradation of the internal power supply 24, does the estimation circuit 29 perform the degradation estimation process in the above described manner.

In view of this, the estimation circuit 29 of this embodiment has the memory 31 or the program that stores beforehand not only the constants a, b, c, and d necessary for performing the degradation estimation process in the above described manner, but also the relation between the temperature T of the internal power supply 24 and the range of the voltage V of the internal power supply 24 that enables accurate estimation of degradation of the internal power supply 24 at the temperature T, as shown in FIG. 8, for example.

Specifically, the estimation circuit 29 stores beforehand a relational expression between the temperature T and the voltage V of the internal power supply 24. The relational expression indicates the dashed line (a straight line or a curved line) that is shown in FIG. 8 and corresponds to the lower limit of the range of the voltage V of the internal power supply 24 that enables an accurate process of estimating degradation of the internal power supply 24 at each temperature T of the internal power supply 24. The above relation can be stored in the form of a table or a list, instead of the relational expression.

According to the study made by the inventors, the lower limit (see the dashed lines in FIG. 9) of the range of the voltage V of the internal power supply 24 that enables an accurate process of estimating degradation of the internal power supply 24 at each temperature T of the internal power supply 24 varies with the value I of the current that is supplied from the charging circuit 25 to the internal power supply 24 so as to increase the voltage V of the internal power supply 24 by a predetermined amount, as shown in the drawing. It should be noted that Ia>Ib>Ic in FIG. 9.

Therefore, in this embodiment, the estimation circuit 29 is designed to store the above relational expression or the like beforehand with respect to each value I of the current that is supplied from the charging circuit 25 to the internal power supply 24 so as to increase the voltage V of the internal power supply 24 by a predetermined amount. Only when the voltage V of the internal power supply 24 measured by the voltage measurement circuit 27 at a time of the degradation estimation process falls within the above described range at the temperature T of the internal power supply 24 measured by the temperature sensor 28, does the estimation circuit 29 perform the process of estimating degradation of the internal power supply 24.

[Specific Procedures in the Internal Power Supply Degradation Estimation Process]

Figure 10:
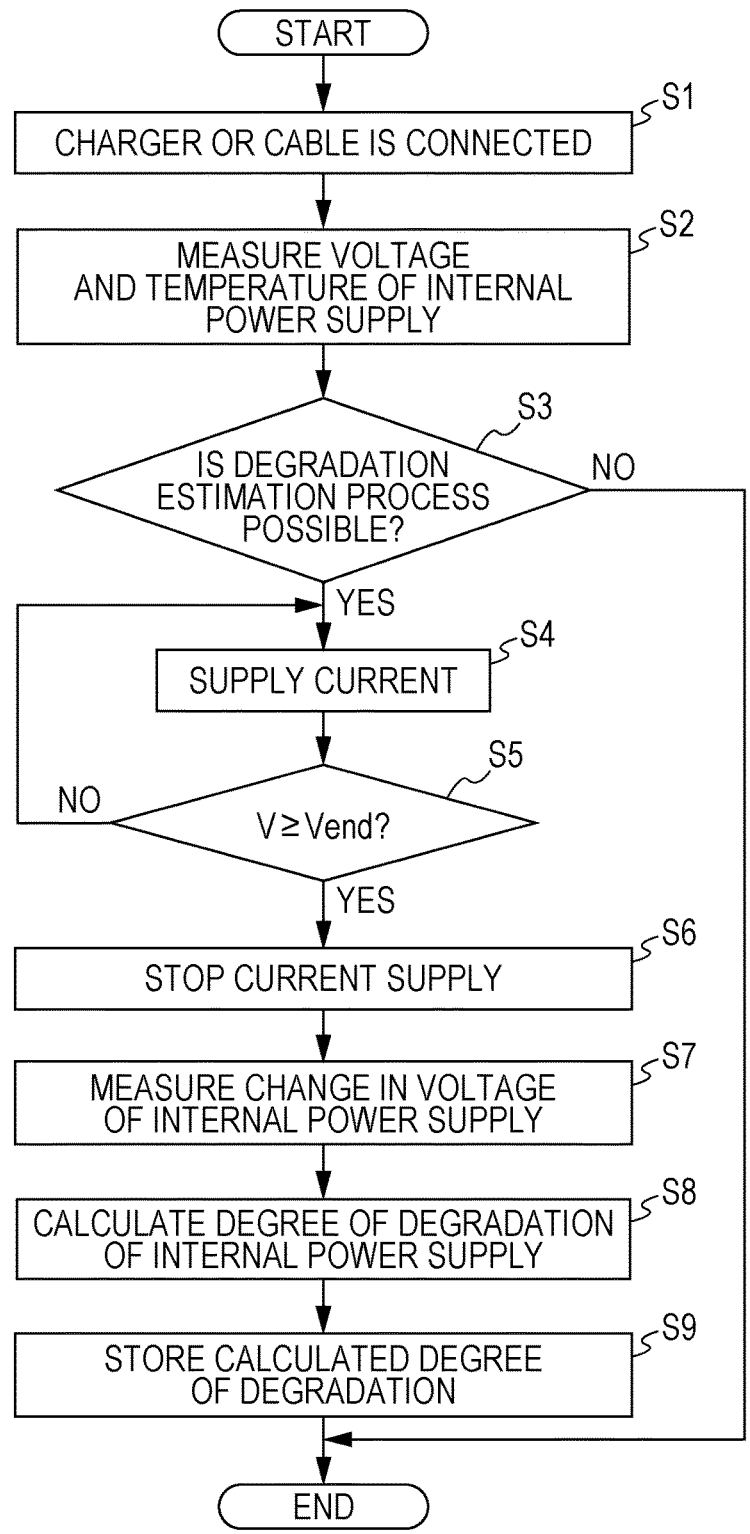
FIG. 10 is a flowchart showing specific procedures to be carried out by the estimation circuit to perform a process of estimating degradation of the internal power supply.

The following is a description of the specific procedures to be carried out when the estimation circuit 29 performs the process of estimating degradation of the internal power supply 24 in the electronic apparatus 1 according to this embodiment, with reference to the flowchart shown in FIG. 10 and the like.

When the electronic apparatus 1 (radiological imaging apparatus 1) is inserted into and connected to the charger Cr such as a cradle (see FIG. 4) by a user, or the cable Ca is connected to the connector 39 (see FIG. 5) by a user (step S1), the estimation circuit 29 causes the voltage measurement circuit 27 to measure the voltage V of the internal power supply 24, and causes the temperature sensor 28 to measure the temperature T of the internal power supply 24 (step S2).

The estimation circuit 29 then determines whether it is possible to accurately perform the process of estimating degradation of the internal power supply 24 based on the above described relational expression (or a table or a list) (step S3). That is, the estimation circuit 29 determines whether the measured voltage V of the internal power supply 24 is equal to or higher than the lower limit (see the dashed lines in FIGS. 8 and 9) of the range of the voltage V of the internal power supply 24 that enables an accurate process of estimating degradation of the internal power supply 24 at the measured temperature T of the internal power supply 24.

If the estimation circuit 29 determines that it is not possible to accurately perform the process of estimating degradation of the internal power supply 24 (NO in step S3), or if the voltage V of the internal power supply 24 is lower than the lower limit of the range of the voltage V of the internal power supply 24 that enables an accurate degradation estimation process, the estimation circuit 29 ends the process of estimating degradation of the internal power supply 24. Modifications of this step will be described later.

Only if the estimation circuit 29 determines that it is possible to accurately perform the process of estimating degradation of the internal power supply 24 (YES in step S3), or only if the voltage V of the internal power supply 24 is equal to or higher than the lower limit of the range of the voltage V of the internal power supply 24 that enables an accurate degradation estimation process, the estimation circuit 29 performs the process of estimating degradation of the internal power supply 24.

In this case, the estimation circuit 29 causes the charging circuit 25 to supply current to the internal power supply 24 (step S4). If the current measurement circuit 26 is provided as described above, the current measurement circuit 26 is made to measure the value I of the current being supplied from the charging circuit 25 to the internal power supply 24. Meanwhile, the estimation circuit 29 calculates an end voltage Vend by adding the above mentioned predetermined amount (100 mV or 200 mV, for example) to the voltage V of the internal power supply 24 measured by the voltage measurement circuit 27 in step S2, and continues the charging of the internal power supply 24 until the voltage V of the internal power supply 24 being increased by the current supply reaches the end voltage Vend (NO in step S5).

When the voltage V of the internal power supply 24 becomes equal to or higher than the end voltage Vend (YES in step S5), the estimation circuit 29 stops the current supply from the charging circuit 25 to the internal power supply 24 (step S6). After the current supply from the charging circuit 25 to the internal power supply 24 is stopped, and the voltage V rapidly drops due to discharge started at the end of the charging of the internal power supply 24, the estimation circuit 29 measures the change $\Delta V$ in the voltage V at the time when the voltage V switches to a slowly decreasing state (or a relaxed state) as shown in FIG. 7 (step S7).

Specifically, as shown in the above equation (1), for example, the change $\Delta V$ in the voltage V of the internal power supply 24 in the relaxed state is calculated as the difference between the voltage $V_1$ of the internal power supply 24 measured by the voltage measurement circuit 27 one second after the time $t_0$ when the current supply from the charging circuit 25 to the internal power supply 24 is stopped and the voltage $V_{10}$ of the internal power supply 24 measured by the voltage measurement circuit 27 ten seconds after the time $t_0$ of the stop of the current supply, as described above.

The estimation circuit 29 then reads the constants a, b, c, and d from the memory 31, and assigns, into the equation (4), the temperature T of the internal power supply 24 measured in step S2, the value I of the current being supplied from the charging circuit 25 to the internal power supply 24 measured in step S4, and the change $\Delta V$ in the voltage V of the internal power supply 24 in the relaxed state measured in step S7. By doing so, the estimation circuit 29 calculates the capacity C of the internal power supply 24, and calculates the degree of degradation of the internal power supply 24 (step S8). The estimation circuit 29 then stores the calculated degree of degradation (the capacity C) of the internal power supply 24 into the memory 31 or the like (step S9).

Figure 11:
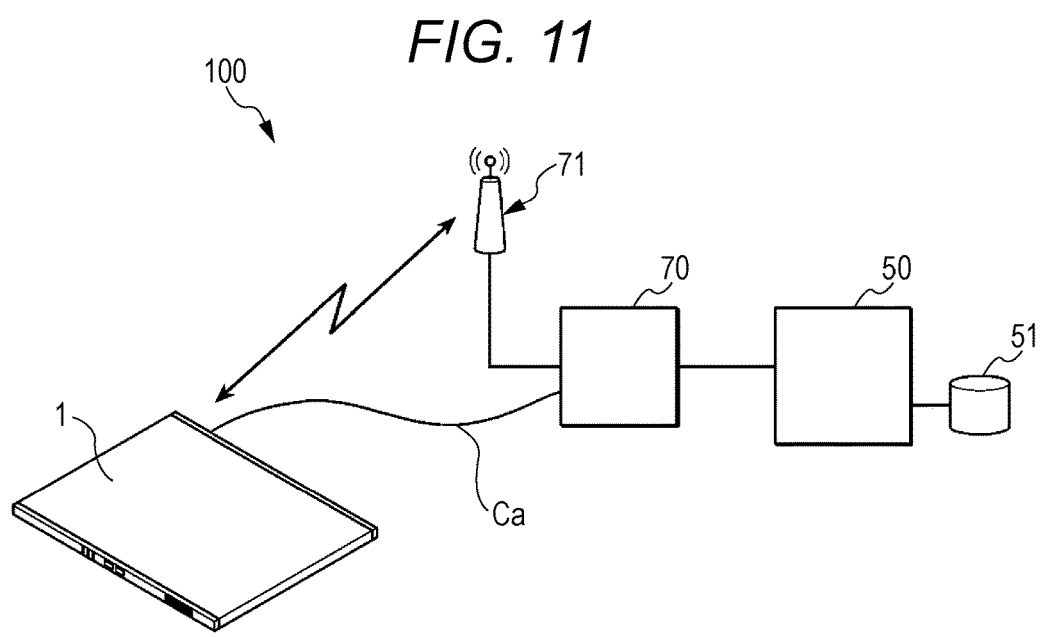
FIG. 11 is a schematic view of an internal power supply degradation estimating system that is designed to perform a process of estimating degradation of an internal power supply with an estimation device independent of the electronic apparatus.

In the above described case, the estimation circuit 29 of the electronic apparatus 1 (radiological imaging apparatus 1) performs the process of estimating degradation of the internal power supply 24. However, in an internal power supply degradation estimating system 100 including the electronic apparatus 1 as shown in FIG. 11, for example, an estimation device 50 formed with a computer or the like independent of the electronic apparatus 1 may be further provided, and the estimation device 50 may be designed to perform the process of estimating degradation of the internal power supply 24 of the electronic apparatus 1.

In this case, the estimation device 50 causes the electronic apparatus 1 to transmit respective pieces of information via a relay unit 70 by performing wireless communication through an access point 71 or wired communication through a cable Ca. The respective pieces of information include the temperature T of the internal power supply 24 measured in step S2 of FIG. 10, the value I of the current being supplied from the charging circuit 25 to the internal power supply 24 measured in step S4, and the change ΔV in the voltage V of the internal power supply 24 in the relaxed state measured in step S7 (or the voltages $V_1$ and $V_{10}$, or the temporal change in the voltage V of the internal power supply 24 shown in FIG. 7). The estimation device 50 can calculate the degree of degradation of the internal power supply 24 by calculating the capacity C of the internal power supply 24 based on those pieces of information (step S8), and store the calculated degree of degradation (the capacity C) of the internal power supply 24 into its own storage unit 51 (step S9).

[Effects]

As described so far, with the electronic apparatus 1 (radiological imaging apparatus 1), the system for estimating degradation of an internal power supply, and a method of estimating degradation of an internal power supply according to this embodiment, the estimation circuit 29 of the electronic apparatus 1 (or the estimation device 50 in the degradation estimating system; the same applies to the description below) performs a degradation estimation process based on the finding through the study made by the inventors that there are cases where the degree of degradation of the internal power supply 24 cannot be accurately estimated depending on the voltage V and the temperature T of the internal power supply 24 of the electronic apparatus 1. That is, the estimation circuit 29 of the electronic apparatus 1 determines whether it is possible to perform the process of estimating degradation of the internal power supply 24 based on the voltage V and the temperature T of the internal power supply 24, and, only when determining that it is possible to perform the degradation estimation process, performs the degradation estimation process based on the temperature T of the internal power supply 24 and the change ΔV in the voltage V of the internal power supply 24 in a relaxed state (or the value I of the current further supplied).

Therefore, if the degree of degradation of the internal power supply 24 of the electronic apparatus 1 cannot be accurately estimated, the degradation estimation process is not performed. The degradation estimation process is performed only when the degree of degradation of the internal power supply 24 of the electronic apparatus 1 can be accurately estimated. Accordingly, the degree of degradation of the internal power supply 24 of the electronic apparatus 1 can be accurately estimated. If the internal power supply 24 has been severely degraded, for example, the internal power supply 24 is replaced with a new one. Accordingly, the internal power supply 24 can be prevented from failing to output electrical power of a correct value. Thus, the electronic apparatus 1 can be appropriately prevented from functioning in a wrong manner or failing to function.

In the electronic apparatus 1 or the like according to this embodiment, the estimation circuit 29 is designed to perform the process of estimating degradation of the internal power supply 24 based not only on the change ΔV in the voltage V of the internal power supply 24 in a relaxed state, but also on the corresponding temperature T of the internal power supply 24 and the value I of the current that is supplied from the charging circuit 25 to the internal power supply 24 so as to increase the voltage V of the internal power supply 24.

Accordingly, in a case where the internal power supply 24 has not been severely degraded, and the change ΔV in the voltage V of the internal power supply 24 in a relaxed state is large simply because the temperature T of the internal power supply 24 is low or the value I of the current being supplied from the charging circuit 25 to the internal power supply 24 is large, the internal power supply 24 can be appropriately prevented from being determined to have been severely degraded, and the degree of degradation of the internal power supply 24 can be accurately estimated.

Further, a calculated degree of degradation (capacity C) of the internal power supply 24 is stored into the memory 31 (see FIG. 6) or the like of the electronic apparatus 1, or the estimation device 50 (see FIG. 11) of the degradation estimating system stores the calculated degree of degradation of the internal power supply 24 into its own storage unit 51 as described above (step S9 in FIG. 10), so that a user or the person who conducts maintenance of the electronic apparatus 1 can check the calculated degree of degradation of the internal power supply 24, and determine whether to replace the internal power supply 24 with a new one.

The above described process of estimating degradation of the internal power supply 24 is not necessarily performed while the internal power supply 24 is being charged. However, in a case where a user inserts and connects the electronic apparatus 1 into a charger such as a cradle, or connects a cable to the connector 39, for example, the user is likely to believe that the internal power supply 24 is charged. Therefore, charging of the internal power supply 24 may be resumed when the above described degradation estimation process is ended.

Furthermore, the process of estimating degradation of the internal power supply 24 may be performed when a user conducts charging of the internal power supply 24 of the electronic apparatus 1 as described above, and the degree of degradation (the capacity C) of the internal power supply 24 stored in the memory 31 of the electronic apparatus 1 or in the storage unit 51 of the estimation device 50 may be transmitted to a management device such as a server connected to the electronic apparatus 1 or the estimation device 50 via a network or the like, so that the management device can manage the degree of degradation of the internal power supply 24.

[Modifications]

Modifications of the above described embodiment are described below.

[First Modification]

In the above described embodiment, if the process of estimating degradation of the internal power supply 24 is determined to be possible (YES in step S3 in FIG. 10), the charging of the internal power supply 24 is continued until the voltage V of the internal power supply 24 measured by the voltage measurement circuit 27 becomes equal to or higher than the end voltage Vend (step S5) calculated as a voltage value by adding a predetermined amount (100 mV or 200 mV, for example) to the voltage V measured in step S2.

However, it is also possible to stop the current supply (step S6) when a predetermined time has passed since the start of the current supply from the charging circuit 25 to the internal power supply 24 (step S4), for example.

[Second Modification]

Further, in the above described embodiment, if the estimation circuit 29 determines that it is not possible to accurately perform the process of estimating degradation of the internal power supply 24 (NO in step S3), the estimation circuit 29 ends the process of estimating degradation of the internal power supply 24. In this case, the indicator 40 (see FIG. 1) of the electronic apparatus 1 may blink in a predetermined manner or emit light in a predetermined color, or a speaker (not shown) provided in the electronic apparatus 1 may be made to emit sound, to notify a user or the person who conducts maintenance or the like that it is not possible to perform the process of estimating degradation of the internal power supply 24.

A notification device independent of the electronic apparatus 1 may be provided, and the notification device can be designed to notify that the process of estimating degradation of the internal power supply 24 cannot be performed, through display or light or sound emission, for example.

When the user or the person who conducts maintenance or the like receives the above notification, the user or the maintenance person or the like can conduct charging of the internal power supply 24 until the voltage V of the internal power supply 24 falls within the range of the voltage V of the internal power supply 24 that enables an accurate process of estimating degradation of the internal power supply 24 (the range being the region above the corresponding dashed line in FIGS. 8 and 9) at the corresponding temperature T of the internal power supply 24 in the electronic apparatus 1. After that, the user or the maintenance person or the like can cause the electronic apparatus 1 to perform the degradation estimation process.

[Third Modification]

The process to be performed by the user or the maintenance person or the like in the above described second modification may be automatically performed by the estimation circuit 29 of the electronic apparatus 1. That is, in the above described embodiment, if the estimation circuit 29 determines that it is not possible to accurately perform the process of estimating degradation of the internal power supply 24 (NO in step S3), the estimation circuit 29 ends the process of estimating degradation of the internal power supply 24.

Figure 12:
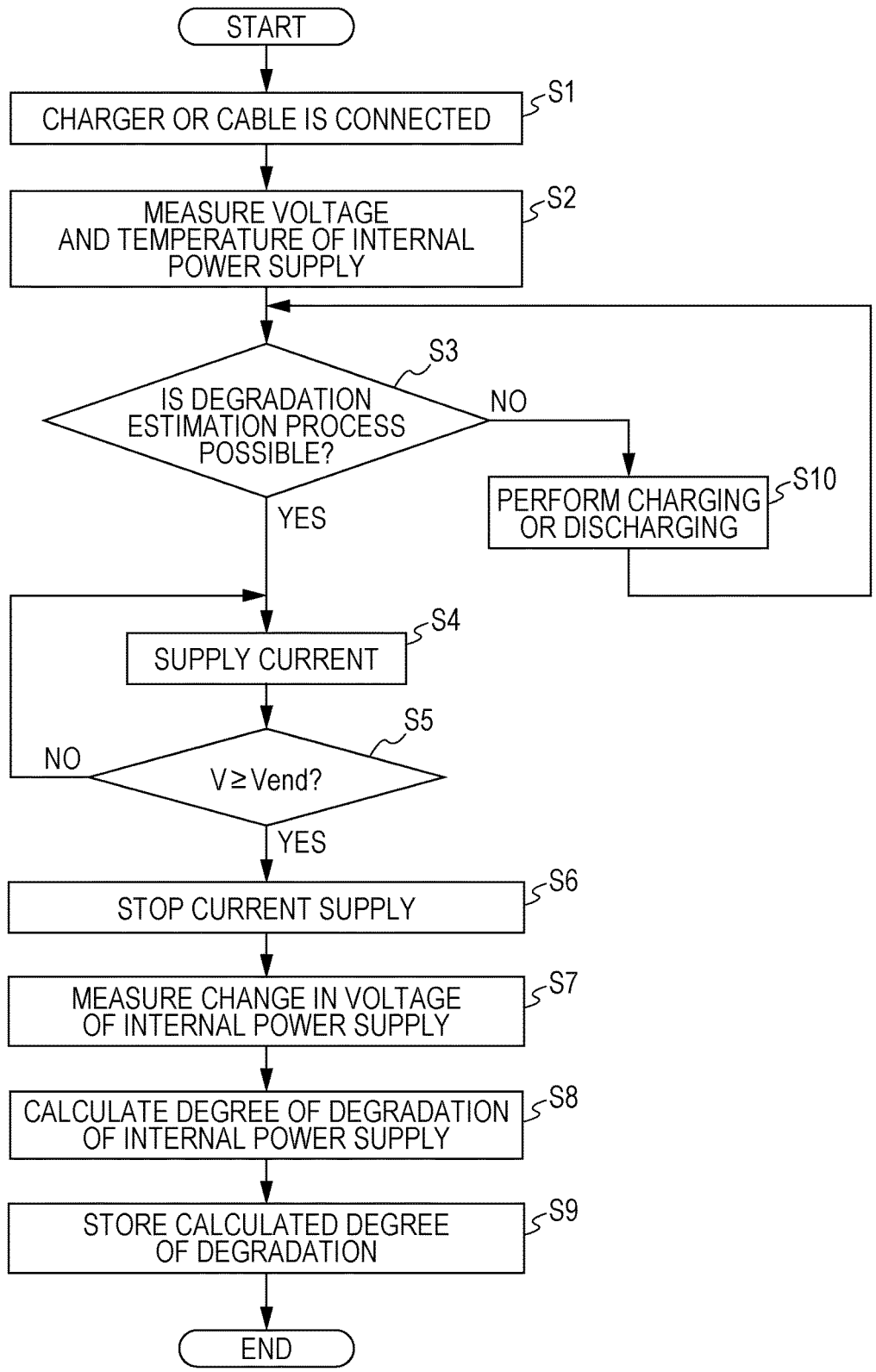
FIG. 12 is a flowchart showing a modification of specific procedures to be carried out by the estimation circuit to perform a process of estimating degradation of the internal power supply.

Instead, as shown in FIG. 12, for example, if the estimation circuit 29 determines that it is not possible to accurately perform the process of estimating degradation of the internal power supply 24 (NO in step S3), the estimation circuit 29 conducts the charging of the internal power supply 24 by causing the charging circuit 25 to supply current to the internal power supply 24 (step S10).

The voltage V of the internal power supply 24 then increases, and falls within the range of the voltage V of the internal power supply 24 that enables an accurate process of estimating degradation of the internal power supply 24 (the range being the region above the corresponding dashed line in FIGS. 8 and 9). When the estimation circuit 29 determines that it is possible to accurately perform the process of estimating degradation of the internal power supply 24 (YES in step S3), current is again supplied from the charging circuit 25 to the internal power supply 24 (step S4), and the processing after step S4 can be performed.

In a case where the voltage V of the internal power supply 24 is the upper limit Vmax (see FIGS. 8 and 9) of voltages V that can be allowed as the voltage V of the internal power supply 24, or is a voltage V in the neighborhood of the upper limit Vmax, the voltage V is further increased by a predetermined amount (100 mV or 200 mV, for example) so that the process of estimating degradation of the internal power supply 24 can be performed. As a result, the voltage V of the internal power supply 24 might exceed the upper limit Vmax of the voltage V of the internal power supply 24.

In the above described embodiment, in such a case, the process of estimating degradation of the internal power supply 24 is determined not to be possible (NO in step S3) through the determination process in step S3 in FIG. 10, and the degradation estimation process comes to an end. However, as shown in step S10 in FIG. 12, for example, discharge from the internal power supply 24 is allowed to a certain degree, and the voltage V of the internal power supply 24 is lowered to such a voltage V that will not exceed the upper limit Vmax of the voltage V of the internal power supply 24 even after the voltage V is further increased by a predetermined amount (100 mV or 200 mV, for example). After the process of estimating degradation of the internal power supply 24 is enabled (YES in step S3), the process of estimating degradation of the internal power supply 24 may be performed.

With such a structure, the electronic apparatus 1 (or the internal power supply degradation estimating system 100 including the estimation device 50) can automatically and accurately perform the process of estimating degradation of the internal power supply 24, and appropriately lower the frequency with which the process of estimating degradation of the internal power supply 24 cannot be performed.

In the above described embodiment and modifications, the history of estimated degrees of degradation of the internal power supply 24 (or estimated capacities C of the internal power supply 24 in the above described embodiment) stored in the memory 31 or the like may be used in performing a process of estimating a future temporal change in degradation of the internal power supply 24 or estimating the time of replacement of the internal power supply 24, for example.

It should be understood that the present invention is not limited to the above described embodiment and modifications, and various changes may be made to them without departing from the scope of the invention.

Although the present invention has been described and illustrated in detail, it is clearly understood that the same is by way of illustrated and example only and is not to be taken by way of limitation, the scope of the present invention being interpreted by terms of the appended claims.

What is claimed is:

1. An electronic apparatus comprising:
   an internal power supply to be charged;
   a charging circuit configured to supply electrical power from an external power supply to the internal power supply;
   a voltage measurement circuit configured to measure a voltage of the internal power supply;
   a temperature sensor configured to measure a temperature of the internal power supply; and
   an estimation circuit configured to estimate a degree of degradation of the internal power supply,
   wherein the estimation circuit
   determines whether it is possible to perform a degradation estimation process to estimate the degree of degradation of the internal power supply by comparing the voltage of the internal power supply measured by the voltage measurement circuit and the temperature of the internal power supply measured by the temperature sensor to a range of voltage of the internal power supply that enables accurate estimation of degradation of the internal power supply at the measured temperature of the internal power supply measured by the temperature sensor, and performs the degradation estimation process on the internal power supply only when determining that the voltage of the internal power supply measured by the voltage measurement circuit is equal to or greater than a predetermined lower limit of the range of voltage of the internal power supply that enables accurate estimation of degradation of the internal power supply at the measured temperature of the internal power supply measured by the temperature sensor,
wherein a change in the voltage of the internal power supply to be used in the degradation estimation process by the estimation circuit is a change in the voltage at a time when the voltage of the internal power supply measured by the voltage measurement circuit switches to a slowly decreasing state after rapidly dropping from a discharge state after a stop of current supply.

2. The electronic apparatus according to claim 1, wherein, when the estimation circuit determines that it is possible to perform the degradation estimation process on the internal power supply, the estimation circuit performs the degradation estimation process based on the temperature of the internal power supply and a change in the voltage of the internal power supply measured by the voltage measurement circuit after supply of current from the charging circuit to the internal power supply is stopped.

3. The electronic apparatus according to claim 1, wherein
the estimation circuit stores beforehand a relation between the temperature of the internal power supply and a range of the voltage of the internal power supply, the degradation estimation process on the internal power supply at the temperature being enabled within the range, and,
when the voltage of the internal power supply measured by the voltage measurement circuit falls within the range at the temperature of the internal power supply measured by the temperature sensor, the estimation circuit determines that it is possible to perform the degradation estimation process on the internal power supply.

4. The electronic apparatus according to claim 1, further comprising
a current measurement circuit configured to measure a value of current being supplied from the charging circuit to the internal power supply,
wherein the estimation circuit determines whether it is possible to perform the degradation estimation process on the internal power supply based not only on the temperature of the internal power supply and a change in the voltage of the internal power supply, but also on the value of the current measured by the current measurement circuit.

5. The electronic apparatus according to claim 4, wherein the estimation circuit calculates a capacity of the internal power supply based on the temperature of the internal power supply, the change in the voltage of the internal power supply, and the value of the current, and estimates the degree of degradation of the internal power supply based on the calculated capacity.

6. The electronic apparatus according to claim 1, further comprising
a storage unit,
wherein the estimation circuit stores, into the storage unit, the degree of degradation of the internal power supply estimated in the degradation estimation process.

7. The electronic apparatus according to claim 1, wherein a lithium-ion capacitor is used as the internal power supply.

8. The electronic apparatus according to claim 1, which is a radiological imaging apparatus including a sensor panel having a plurality of radiation detecting elements two-dimensionally arranged therein.

9. The electronic apparatus according to claim 1, wherein, when the estimation circuit determines that it is not possible to perform the degradation estimation process on the internal power supply, the estimation circuit performs the degradation estimation process on the internal power supply after conducting charging of the internal power supply or conducting discharging from the internal power supply until the voltage of the internal power supply becomes a voltage enabling the degradation estimation process to be performed on the internal power supply at least at the temperature of the internal power supply measured by the temperature sensor.

10. The electronic apparatus according to claim 1, further comprising
a notifying unit,
wherein, when the estimation circuit determines that it is not possible to perform the degradation estimation process on the internal power supply, the estimation circuit uses the notifying unit to notify that it is not possible to perform the degradation estimation process on the internal power supply.

11. An internal power supply degradation estimating system, comprising:
the electronic apparatus according to claim 1; and a notification device,
wherein, when the estimation circuit determines that it is not possible to perform the degradation estimation process on the internal power supply, the estimation circuit causes the notification device to notify that it is not possible to perform the degradation estimation process on the internal power supply.

12. An internal power supply degradation estimating system comprising:
an electronic apparatus including:
an internal power supply to be charged;
a charging circuit configured to supply electrical power from an external power supply to the internal power supply; and
a voltage measurement circuit configured to measure a voltage of the internal power supply;
an estimation device configured to estimate a degree of degradation of the internal power supply of the electronic apparatus; and
a temperature sensor configured to measure a temperature of the internal power supply,
wherein the estimation device
determines whether it is possible to perform a degradation estimation process to estimate the degree of degradation of the internal power supply by comparing the voltage of the internal power supply measured by the voltage measurement circuit and the temperature of the internal power supply measured by the temperature sensor to a range of voltage of the internal power supply that enables accurate estimation of degradation of the internal power supply at the measured temperature of the internal power supply measured by the temperature sensor, and
performs the degradation estimation process on the internal power supply only when determining that the voltage of the internal power supply measured by the voltage measurement circuit is equal to or greater than a predetermined lower limit of the range of voltage of the internal power supply that enables accurate estimation of degradation of the internal power supply at the measured temperature of the internal power supply measured by the temperature sensor, wherein a change in the voltage of the internal power supply to be used in the degradation estimation process by the estimation circuit is a change in the voltage at a time when the voltage of the internal power supply measured by the voltage measurement circuit switches to a slowly decreasing state after rapidly dropping from a discharge state after a stop of current supply.

13. A method of estimating a degree of degradation of an internal power supply of an electronic apparatus including:

an internal power supply to be charged;

a charging circuit configured to supply electrical power from an external power supply to the internal power supply;

a voltage measurement circuit configured to measure a voltage of the internal power supply; and a temperature sensor configured to measure a temperature of the internal power supply, the method comprising:

a determination step of determining whether it is possible to perform a degradation estimation process to estimate the degree of degradation of the internal power supply by comparing the voltage of the internal power supply measured by the voltage measurement circuit and the temperature of the internal power supply measured by the temperature sensor to a range of voltage of the internal power supply that enables accurate estimation of degradation of the internal power supply at the measured temperature of the internal power supply measured by the temperature sensor, and a degradation estimation step of performing the degradation estimation process on the internal power supply only when the voltage of the internal power supply measured by the voltage measurement circuit is equal to or greater than a predetermined lower limit of a range of voltage of the internal power supply that enables accurate estimation of degradation of a range internal power supply at the measured temperature of the internal power supply measure by the temperature sensor, wherein a change in the voltage of the internal power supply to be used in the degradation estimation process by the estimation circuit is a change in the voltage at a time when the voltage of the internal power supply measured by the voltage measurement circuit switches to a slowly decreasing state after rapidly dropping from a discharge state after a stop of current supply.

* * * * *